United States Patent [19]

Takahashi

[11] Patent Number: 4,937,228

[45] Date of Patent: Jun. 26, 1990

[54] METHOD OF PRODUCING COMPOSITE OXIDE SUPERCONDUCTING WIRES USING A POWDER BATH

[75] Inventor: Susumu Takahashi, Yokohama, Japan

[73] Assignee: Kanto Yakin Kogyo K.K., Japan

[21] Appl. No.: 305,580

[22] Filed: Feb. 3, 1989

Related U.S. Application Data

[63] Continuation-in-part of Ser. No. 114,836, Oct. 30, 1987, abandoned.

[30] Foreign Application Priority Data

Aug. 24, 1987 [JP] Japan ................................ 62-209485

[51] Int. Cl.$^5$ ............................ B05D 1/24; B05D 3/02
[52] U.S. Cl. ......................................... 505/1; 505/740; 505/739; 427/62; 427/120; 427/185; 427/190; 427/314; 427/318
[58] Field of Search .................. 427/62, 63, 120, 330, 427/318, 314, 185, 190; 505/1, 740, 818; 29/599; 428/631, 632, 633; 174/118, 110 A

[56] References Cited

U.S. PATENT DOCUMENTS 4,170,494 10/1979 Fujii et al. ............................ 427/185
4,826,808 5/1989 Yurek et al. ............................ 505/1

FOREIGN PATENT DOCUMENTS 50-93094 8/1975 Japan .

OTHER PUBLICATIONS

Jin et al., (I), "Fabrication of Dense $Ba_2YCu_3O_{7-\delta}$ Superconductor Wire by Molten Oxide Processing", Appl. Phys. Lett. 51(12), Sep. 87, p. 943.
Jin et al., (II), "High Tc Superconductors–Composite Wire Fabrication", Appl. Phys. Lett. 51(3), Jul. 1987, pp. 203–204.

Primary Examiner—Norman Morgenstern
Assistant Examiner—Roy V. King
Attorney, Agent, or Firm—Shlesinger, Fitzsimmons & Shlesinger

[57] ABSTRACT

A superconductive substance is formed into fine wires readily without producing surface defects on the wires and correctly with a predetermined even diametric thickness. Highly refractory metallic core is heated to a predetermined temperature higher than the eutectic point of powders which constitute the superconductive substance, and passed through said powders whereby the powders which make contact with the core melt and adhere to the core with a predetermined uniform thickness, forming a fine wire made from the superconductive substance.

1 Claim, No Drawings

METHOD OF PRODUCING COMPOSITE OXIDE SUPERCONDUCTING WIRES USING A POWDER BATH

CROSS-REFERENCE TO RELATED APPLICATION

This is a continuation-in-part application of U.S. Patent application Ser. No. 114,836 filed Oct. 30, 1987 now abandoned.

BACKGROUND OF THE INVENTION

This invention relates to a processing method of oxides or ceramic system superconductive substances, and more particularly it relates to a method of processing said substances to wires so that they can readily be utilized in electric or electronic apparatuses.

While oxides or ceramic system superconductive substances come lately into the limelight in electronic industrial fields, scopes of their practical utilization shall rapidly be enlarged when inventions and development in them especially high temperature superconductive substances are further made. However, even if high temperature superconductive substances or materials of extremely high conductivity were invented or developed, their scopes of utilization will inevitably be limited unless they can be processed into desired configurations suited to purposes of their utilization, such as films, wires, tapes, and so on. Among these configurations, a wire shape would most extensively be utilized for many purposes such as for wires forming a coil, though it is difficult to have oxides or ceramic system superconductive materials processed to wire shapes, and though practical or industrially employable methods therefor have not been established. While it has been known to have superconductive substances drawn repeatedly so that they are formed into wires, it is extremely difficult by this conventional method to obtain wires which are uniform in dimensions and shapes, and do not have any broken portion. A proposal has been made, in which constituent powder raw materials of a superconductive substance are heated, melted, and poured into pipe-shaped sheathes so that the superconductive substance is shaped to a wire. Though this proposal can be carried out in a laboratory scale but can hardly be employed in a practically employable industrial scale. It is proposed also in Jin et al, Applied Physics Letters, 21 Sept. 87, Vol 51, No. 12, pp 943-45 that a Ag- or silver-coated metal wire is utilized as a metal core which serves initially to mechanically support an oxide powder and binder composite. Said Ag- or silver-coated metal wire makes a preform-wire with the oxide/binder composite thereof. This preform-wire is then melt processed by rapidly moving a torch flame and melting the outer portion of the oxide shell. This method is, however, very difficult not only to control a thickness of the oxide shell but also to obtain a smooth and uniform oxide shell, because the shell-making on the wire depends primarily upon the binder. It is nearly impossible to mechanically apply the oxide/binder powdery composite which is sticky, onto cylindrical surfaces of the wire in uniform dimension and shape, and without any pin hole therein. It is nearly impossible in this method also to heat only the thin outer portion of the slender Ba-Y-Cu-O shell without deforming and decomposing the Ag-wire which is also slender and the melting temperature of which is apparently lower than that of the Ba-Y-Cu-O shell. Should the Ag-wire and Ba-Y-Cu-O shell are thick enough to stand on the torch flame without being adversely affected as above-mentioned, they have to be drawn repeatedly after they have been subjected to the torch flame, whereby it becomes more difficult to obtain wires which are uniform in dimensions and shapes, and do not have any broken or pin-holed portion.

BRIEF SUMMARY OF THE INVENTION

In this invention, metals such as Mo which have a melting point higher than constituent powders of oxides or ceramic system superconductive materials, are employed as a core wire. As used herein the melting point of the mixture of consituent powders refers to their eutectic point or temperature. This metallic core wire is made to have a desired diameter, heated to a temperature substantially higher than the melting point of said constituent superconductive powders, and then passed through the powders so that the powders which have been melted by coming into contact with the heated metallic wire core adhere to the core and form on the core films of an even thickness, which are made of oxides or ceramic system superconductive materials. Diameters of wires of a superconductive substance obtained in accordance with this invention method can be determined as desired and be always uniform throughout their entire length, since diameters of core metallic wires can readily be selected as desired, and a thickness of films of the superconductive substance to be formed on the core can also be selected freely by the control of a heating temperature of the core and a passing speed thereof through the superconductive constituent powders. The core wires thus coated by films of a superconductive substance are preferably subjected to a heat treatment for annealing. Further, in order to prevent breakage of a fragile superconductive substance, the wires obtained in accordance with this invention as briefed above may be passed through a bath contained with molten metals such as copper, aluminium, lead, and alloys thereof which can form elastic protective outermost films on the wires.

EXAMPLES

The method of this invention which has been briefed above, is further explained by way of following examples. 1. A wire of Mo (having a melting point of 2,622° C.) of 500$\mu$ in diameter was employed as a core. This core metallic wire was heated to 1,500° C. by passing through an induction heating furnace, and immediately subsequently passed through an elongated bath at its elongated direction, which contained constituent powders of superconductive substance. The powders were consisted of $Y_2O_3$, $BaCO_3$, and $CuO$ at ratios of 1:2:3

A film of superconductive substance of $YBa_2Cu_3O_x$ (O being 6.5-7.2) having a uniform thickness of 100 $\mu$ was thus formed on the Mo core, when said core wire came out from the powder bath. The wire was annealed by 1,000° C. in a $O_2$ atmosphere. The electron microscopy showed that the film of superconductive substance formed on the core wire was uniform and had no surface defects such as cracks or pin holes. The wire was passed further through a Cu bath, whereby it was coated at its outer surface with Cu of 100$\mu$ thickness.

The superconductive wire thus obtained showed its characteristics: superconductivity began at 93K; zero resistance at 86K; no substantial change of resistance between 300K to 100K, and rapid decrease at about 90K.

The above characteristics were measured by the following method. To wit, a wafer cryostat system (Model WM-365) made by Sanwa Radio Measurement Works, Tokyo, Japan, was employed. This system has an upper stage chamber with four probes and controllable to a desired temperature of $-190°$ C.$-+199°$ C. by means of indirect cooling with liquid nitrogen. The superconductive wire which had been cut vertically to its longitudinal direction into a piece of wafer, was placed on the stage chamber. The four probes were positioned on the wafer piece sample at its circular film of superconductive substance, outer two of which probes were connected in turn to an electric source, and inner two of which probes were connected to a nano-ohm meter (Model 8080) of the same manufacture, whereby resistivity of the sample was measured by reading the meter by means of 4 probe method, while changing a temperature of the stage chamber.

2. Similarly to the above Example 1, a Mo core wire was passed through powders of La, Ba, CuO, and the obtained wire was subjected to a heat treatment at 960° C. A uniform film of $(La, Ba)_2CuO_4$ was formed on the core wire. Observation by an electron microscope did not find any surface defect on the superconductive film formed on the core at an even thickness.

As described above, wires made of oxides or ceramic system superconductive substances are readily obtained by the method in accordance with this invention, and there were not found any surface defect in the wires.

I claim:

1. A method for producing a composite oxide superconductive wire, comprising, providing a bath containing a powder mixture of the constituent powders, which produce a rare earth alkaline earth copper oxide superconductive substance, said constituent powders comprising either a mixture of $Y_2O_3$, $BaCO_3$ and $CuO$ in a stoichiometric ratio to form $YBa_2Cu_3O_x$, wherein x is in the range of approximately 6.5 to 7.2, or a mixture of La, Ba and CuO in a stoichiometric ratio to form $(La, Ba)_2Cu O_4$, providing a fine, Mo wire of a desired diameter and having a melting point which is higher than the eutectic point of the constituent powders of said superconductive substance, heating said wire to a predetermined temperature higher than the eutectic point of said constituent powders;

passing said heated fine wire through the constituent powders, whereby the powders which have been melted by coming into contact with the heated fine wire, melt and adhere to the wire to form a precursor oxide film of the superconductive substance on the wire at a predetermined diametric thickness;

subjecting the wire and the film thereon to a heat treatment under an oxygen atmosphere for annealing to form an oxide film of the superconductive substance on the wire; and passing the annealed wire through a molten bath containing a coating material selected from the group consisting of copper, aluminum, lead, or alloys thereof, the temperature of said bath being lower than the melting point of the annealed wire, including the film of the superconductive substance thereon, whereby a protective coating is additionally formed over the film of superconductive substance.

* * * * *